United States Patent [19]
Sato et al.

[11] Patent Number: 5,583,379
[45] Date of Patent: Dec. 10, 1996

[54] OUTER LEAD FOR A SEMICONDUCTOR IC PACKAGE HAVING INDIVIDUALLY ANNEALED PLATED LAYERS

[75] Inventors: Kazuhisa Sato; Kazuo Kimura, both of Nagoya, Japan

[73] Assignee: NGK Spark Plug Co., Ltd., Nagoya, Japan

[21] Appl. No.: 514,838

[22] Filed: Aug. 14, 1995

Related U.S. Application Data

[63] Continuation of Ser. No. 236,195, May 4, 1994, abandoned.

[30]  Foreign Application Priority Data

Sep. 3, 1993  [JP]  Japan .................................. 5-243833

[51] Int. Cl.$^6$ .................................................. H01L 23/48
[52] U.S. Cl. ........................ 257/736; 257/750; 257/766; 437/188
[58] Field of Search ..................................... 257/750, 735, 257/736, 741, 766, 750; 437/188, 247, 248

[56] References Cited

U.S. PATENT DOCUMENTS 5,010,388  4/1991  Sasame et al. ........................ 257/750

FOREIGN PATENT DOCUMENTS

| | | |
|---|---|---|
| 58-104193 | 6/1983 | Japan . |
| 58-147581 | 9/1983 | Japan . |
| 60-46769 | 10/1985 | Japan . |
| 64-48331 | 2/1989 | Japan . |
| 1-302844 | 12/1989 | Japan . |
| 2-17662 | 1/1990 | Japan . |
| 2-104647 | 8/1990 | Japan . |
| 3-270260 | 12/1991 | Japan . |
| 4-294009 | 10/1992 | Japan . |

*Primary Examiner*—Jerome Jackson
*Assistant Examiner*—Nathan K. Kelley
*Attorney, Agent, or Firm*—Foley & Lardner

[57] ABSTRACT

An outer lead having a plurality of external leads 1 for electrically connecting the semiconductor IC of a semiconductor IC package to external devices comprises a base plate 11, a plated base structure formed over the surface of the base plate 11 and consisting of a plurality of plated base layers 12, 13 and 14 of Ni or a Ni alloy, and a surface layer 15 of Au or an Au alloy formed over the uppermost plated base layer 14 of the plated base structure. The number of the plated base layers is at least three. Each plated base layer 12, 13 and 14 of the plated base structure is subjected to crystal-growth annealing after being formed by plating to crystal-grow the grains thereof. A method of fabricating such an outer lead is provided.

10 Claims, 3 Drawing Sheets

OUTER LEAD FOR A SEMICONDUCTOR IC PACKAGE HAVING INDIVIDUALLY ANNEALED PLATED LAYERS

This application is a continuation of application Ser. No. 08/236,195 filed May 4, 1994, now abandoned.

BACKGROUND OF THE INVENTION

1. Field of the Invention

The present invention relates to a semiconductor IC package containing an IC chip comprising semiconductor devices and, more specifically, to an outer lead, i.e., external terminals, provided on a ceramic package to connect the semiconductor devices contained in the ceramic package electrically to external electric circuits, and a method of fabricating such an outer lead.

2. Description of the Related Art

There are various known packages including those of a flat package type and a pin grid array type for containing a semiconductor IC comprising semiconductor devices. These packages are provided with leads to connect semiconductor devices contained therein electrically to external electric circuits. Generally, when fabricating the outer lead, the surface of a base plate is subjected to Ni plating for surface preparation, and then the Ni-plated surface is subjected to Au plating to form an Au surface layer for preventing the deterioration of the surface quality of the outer lead attributable to corrosion or oxidation and to secure satisfactory conductivity and soldering property.

The base plate thus coated with the plated layers is still subject to corrosion. Although the corrosion of the plated metal layers, the peeling of the incompletely plated metal layers and such are possible causes of corrosion of the base plate, the dissolution of part of the base plate into water penetrated through pinholes penetrating the plated metal layers and reaching the surface of the base plate and acting as an electrolyte that provides local cells resulting from the difference in potential between the plated metal layer and the base plate is the most general cause of corrosion of the base plate.

If the base plate dissolves reducing its sectional area, there is the possibility that the strength of the base plate becomes reduced and, in the worst case, the base plate breaks. A prevalent means for preventing the corrosion of the base plate merely forms a plurality of superposed plated layers to reduce pinholes penetrating through the plated layers and reaching the surface of the base plate. Other means for preventing the corrosion of the base plate forms a plurality of plated layers of different materials or finishes the base plate or each plated layer by washing.

For example, a four-layer electric contact material is disclosed in Japanese Patent Laid-open (Kokai) No. Hei 4-294009. This electric contact material consists of a Cu or Cu alloy base plate, i.e., a first layer, an amorphous alloy or Co alloy layer, i.e., a second layer, formed over the surface of the base plate to prevent the corrosion and diffusion of the material of the base plate, a Ni alloy layer, i.e., a third layer, formed over the amorphous alloy or the Co alloy layer, and a corrosion-resistant plated Au layer, i.e., a fourth layer, formed over the Ni alloy layer. The Ni alloy layer is formed to reduce the surface potential difference between the Au layer and the layer underlying the Au layer. This electric contact material is featured by the plurality of plated layers of different materials, and is intended to prevent the corrosion of the Cu or Cu alloy base plate by suppressing the formation of a local cell by the third and the fourth layer providing a small potential difference therebetween.

However, the conventional outer lead having a plurality of superposed plated layers of different materials to prevent the corrosion of the base or merely incorporating means for preventing the formation of a local cell has the following disadvantages. Although the plurality of simply superposed plated layers are effective in reducing pinholes penetrating the plated layers and reaching the surface of the base plate, the plurality of plated layers increases the size of the leads of the outer lead and such leads having an increased size can be connected only to a special external electric circuit. If the thickness of each of the plated layers is reduced, pinholes reaching the surface of the base plate cannot be reduced. On the other hand, excessively thick plated layers and the plurality of plated layers will increase the cost of the outer lead.

The recent development of multifunction ICs and progressive increase in the degree of integration of the component devices ICs require an outer lead having a large number of leads arranged at very small intervals. In such an outer lead, external leads coated with a plurality of plated layers and having an increased size are liable to be short-circuited. Although the external leads of a conventional outer lead, having a comparatively large sectional area do not break even if its base plate is corroded due to the corrosive action of water penetrating the plated layers through pinholes formed in the plated layers, very small leads, such as leads of 0.18 mm in width and 0.13 mm in thickness, breaks even if only a small portion of the base plate is corroded. If even a single lead among those of the outer lead has pinholes reaching the surface of the base plate, the lead having pinholes is corroded eventually, causing the electronic apparatus provided with this outer lead to malfunction. Therefore, the entire surface of the base plate of the outer lead must be coated with plated layers perfectly free of pinholes reaching the base plate. However, it cannot be expected that such plated layers perfectly free of pinholes reaching the base plate can be formed by a plating process which simply superposes a plurality of plated layers, and the plating process has a low yield rate and hence is practically applicable.

An attempt to enhance the corrosion resistance of the outer lead by providing the outer lead with a plurality of plated layers of different materials requires a plurality of plating baths, which increases the cost of equipment, and a plurality of plating processes, which complicates the outer lead fabricating process.

SUMMARY OF THE INVENTION

The present invention has been made to solve the foregoing problems and it is therefore an object of the present invention to provide an outer lead having a base plate coated with a dense plated structure consisting of comparatively thin plated layers having only few pinholes, and a semiconductor IC package having a reliable quality, and provided with the aforesaid outer lead which will not cause the disconnection of the lines of the associated electric circuits.

With this object in view, the present invention provides an outer lead for a semiconductor IC package, comprising a base plate, a plurality of base layers formed by plating and consisting of grains grown by a crystal growth process, and a surface layer formed by plating over the uppermost one of the plurality of base layers.

Desirably, the base layers are three or more plated layers of Ni or a Ni alloy and the surface layer is a plated layer of Au or a Au alloy. A Fe/Ni alloy is a suitable material of which the base plate is made.

The present invention provides also a method of fabricating such an outer lead as mentioned above for a semiconductor IC package, comprising a step of alternately repeating a plating process of forming a base layer over the surface of a base plate and an annealing process of promoting the crystal growth of the grains of the base layer a plurality of cycles, and a step of forming a surface layer over the uppermost one of the base layers.

Desirably, the surface of the base plate is treated by a chemical etching process before forming the base layers by plating.

In the outer lead for a semiconductor IC package, thus fabricated in accordance with the present invention, the base layer of Ni or a Ni alloy have a crystal texture consisting of grains densely arranged without gaps in grain boundaries. Therefore, penetrating pinholes are not formed in each base layer, and hence any pinholes penetrating all the base layers and reaching the surface of the base plate are not formed. Consequently, the corrosion of the base plate by the corrosive action of local cells does not occur and disconnection and short circuit of the lines of the semiconductor IC contained in the ceramic package and the associated electric circuit do not occur.

The treatment of the base plate by chemical etching before forming the bottom base layer of Ni or a Ni alloy by plating enhances the adhesion of the bottom layer to the base plate and the density of the grains, and further reduces pinholes.

BRIEF DESCRIPTION OF THE DRAWINGS

The above and other objects, features and ages of the present invention will become more apparent from the following description taken in connection with the accompanying drawings, in which.

DETAILED DESCRIPTION OF THE PREFERRED EMBODIMENTS

Figure 1:
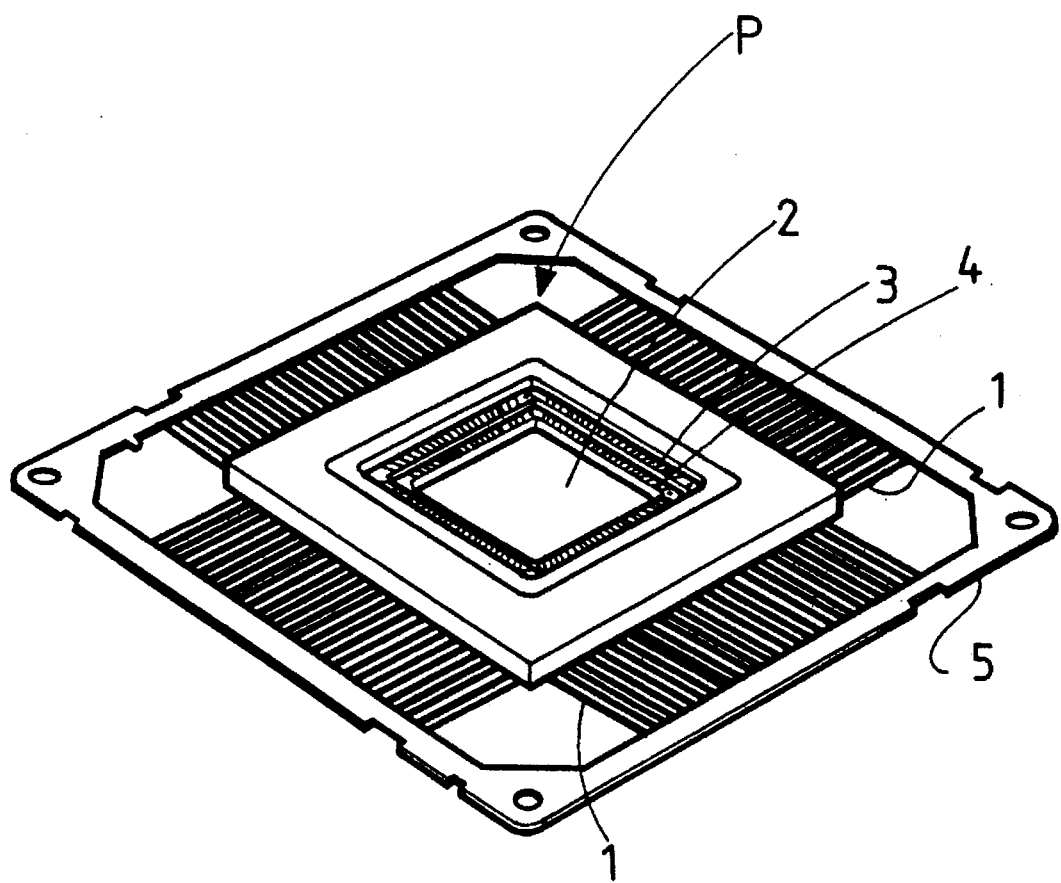
FIG. 1 is a perspective view of a ceramic package provided with an outer lead in a preferred embodiment according to the present invention.

Referring to FIG. 1 showing a ceramic package P provided with an outer lead in a preferred embodiment according to the present invention, the ceramic package P is provided with a die pad 2 to support an IC chip, not shown, in its central part, and a plurality of internal leads 3 and 4 arranged around the die pad 2 in two steps. The internal leads 3 and 4 are connected electrically to a plurality of external leads 1 of an outer lead, projecting from the four sides of the ceramic package P, respectively. The terminals of the IC chip are connected to the internal leads 3 and 4, respectively, by wire bonding to connect the IC chip electrically through the leads 1 to external devices, not shown. At this stage, the extremities of the leads 1 are connected to a frame 5 formed when forming the outer lead by punching or etching and reserved to facilitate handling the outer lead in processing the outer lead for plating and such. When connecting the IC chip to external devices, the frame 5 is cut off.

Figure 2:
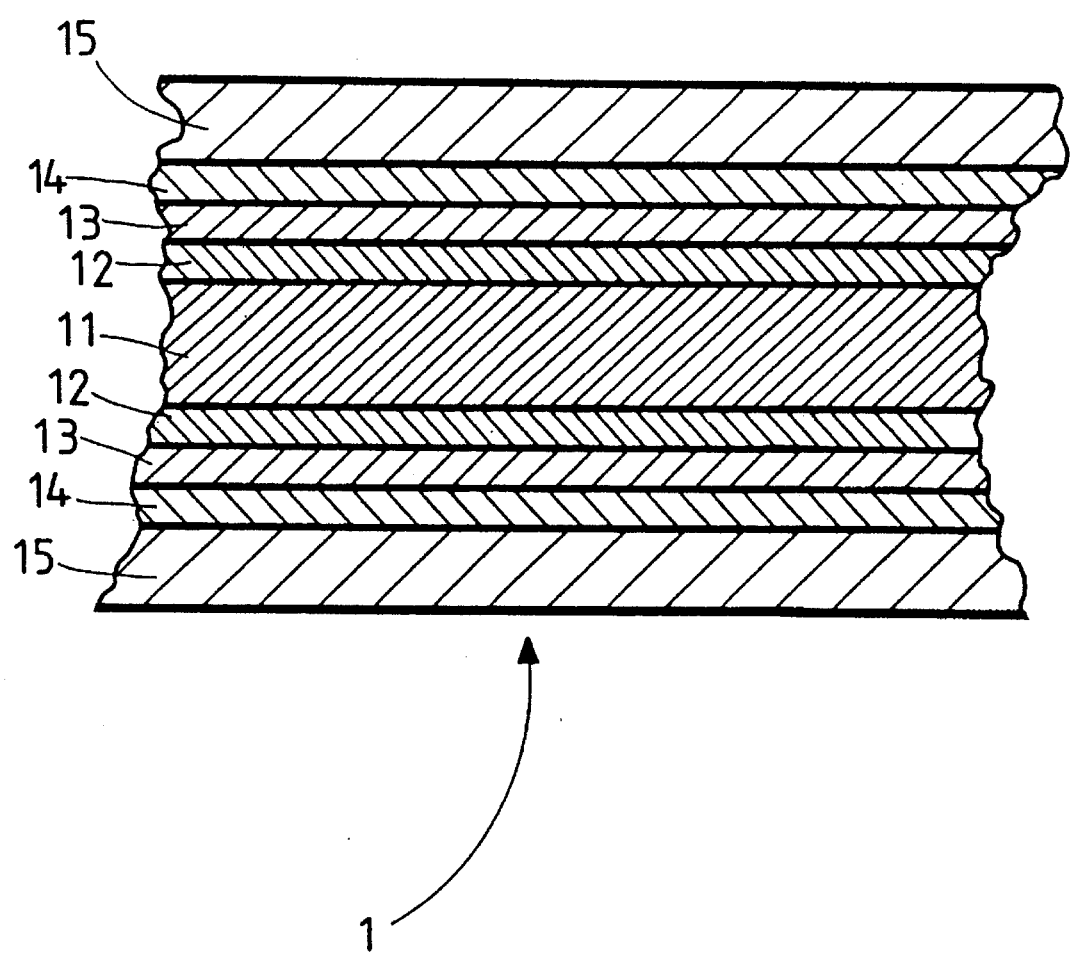
FIG. 2 is a sectional view of the external lead of the outer lead of FIG. 1, provided with a plurality of plated base layers.

Referring to FIG. 2 typically showing the plated structure of Ni of one of the external leads 1 of the outer lead as bonded to a flat package type ceramic package, sequentially formed by plating over the surface of a base plate 11 are three Ni base layers, namely, a first Ni base layer 12, a second Ni base layer 13 and a third Ni base layer 14, and one Au surface layer 15. The base layers 12, 13 and 14 may be Ni alloy layers, Ni/Co alloy layers, Ni/Pd alloy layers or Ni/Sn alloy layers. The Au surface layer 15 protects the lead 1 from the corrosive actions of moisture, acids, alkalis and the like contained in the atmosphere because Au is particularly excellent in acid resistance, alkali resistance and corrosion resistance. The Au surface layer may be substituted by an Au alloy surface layer. The Ni base layers 12, 13 and 14 suppresses the action of local cells that may be formed between the base plate 11 and the Au surface layer 15.

The outer lead in this embodiment has 172 external leads having a rectangular cross section of 0.18 mm in width and 0.13 mm in thickness. The base plate 11 is formed of Kovar (29% by wt. Ni/16% by wt. Co/55% by wt. Fe). Kovar is the most suitable alloy for forming the base plate 11 to be bonded to a ceramic package because the the thermal expansion coefficient 6×10–8/° C. of Kovar is substantially equal to that of ceramic.

Figure 3:
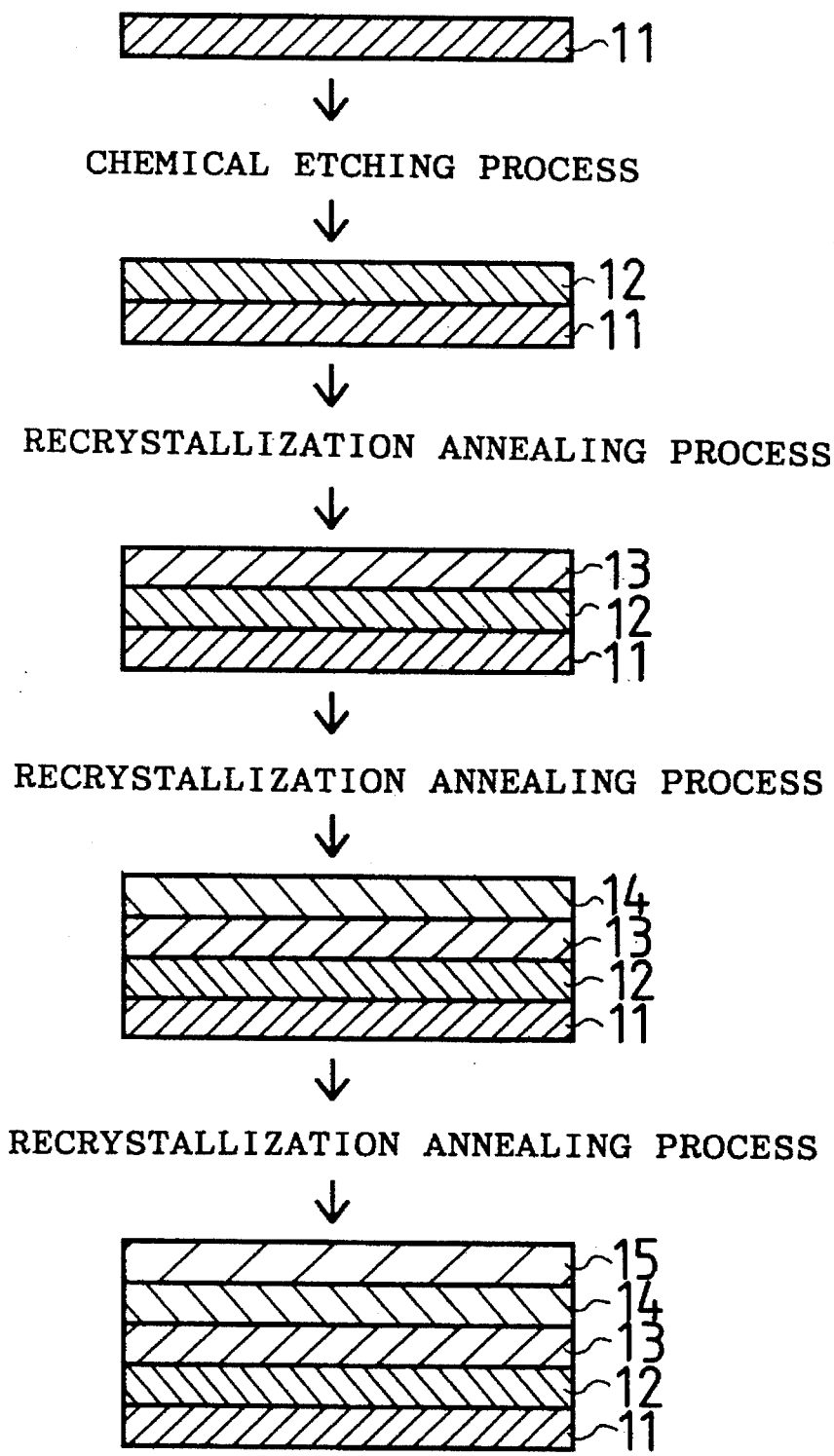
FIG. 3 is a diagrammatic view of assistance in explaining steps of a method of fabricating an outer lead, in a preferred embodiment according to the present invention.

A method of fabricating the outer lead provided with the plated base structure of Ni will be described with reference to FIG. 3.

The base plate 11 as bonded to the ceramic package P is immersed in a Ni plating bath together with the ceramic package P to form the first Ni base layer by electroplating. When desired, the base plate 11 is subjected to a chemical etching process to clean the surfaces of the base plate 11 prior to forming the first Ni base layer 12 by electroplating to enhance the adhesion of the first Ni base layer 12 to the base plate 11. The chemical etching process comprises steps of immersing the base plate 11 in an alkaline solution to remove oils and the like from the surfaces, immersing the base plate 11 in an acidic solution to expose the perfectly clean surfaces of the base plate 11, and washing the base plate 11 with water. The chemical etching process removes impurities adhering to the surfaces of the base plate 11 completely to ensure satisfactory plating.

After the first Ni base layer 12 has dried, the work is subjected to a first recrystallization annealing process, in which the work is heated at temperatures not lower than the recrystallization temperature of Ni in the range of 600° to 700° C. for a time period in the range of five to fifteen minutes for recrystallization to promote the growth of the deposited Ni grains of the first Ni base layer 12 so that gaps in the boundaries of Ni grains disappear. Since the external leads 1 are soldered to the ceramic package P with a silver solder, the silver solder will melt and the external leads 1 will fall off the ceramic package P if the work is heated at a temperature of 700° C. or above and, therefore, the annealing temperature is in the range of 600° to 700° C. The plated Ni layer can be most efficiently annealed when heated for a time period in the range of five to fifteen minutes.

However uniformly the plated layer may be formed, the plated layer has microscopic pinholes. As is generally known, in an electroplating process, the plating material is liable to be deposited on the previously deposited material and it is difficult to deposit the plating material so as to fill up pinholes. Therefore, if a second plated layer is formed over a previously formed first plated layer having pinholes, it is difficult to fill up the pinholes and, consequently, pinholes will be formed in the second plated layer.

The recrystallization annealing process promotes the growth of the Ni grains of the first Ni base layer 12, which in turn eliminates gaps in the boundaries of the Ni grains to enhance the adhesion of the second Ni base layer 13 to the first Ni base layer 12. After the first Ni base layer 12 has been annealed, the work is immersed in a Ni plating bath and the second Ni base layer 13 of Ni is formed by electroplating. After the second Ni base layer 13 has dried, the work is subjected to a second recrystallization annealing process. Then, the work is immersed in the Ni plating bath again for the third time to form the third Ni base layer 14. The third Ni base layer 14 is dried, and then the work is subjected to a third recrystallization annealing process.

After the Ni base layers 12, 13 and 14 of Ni have been thus formed, the work is immersed in an Au plating bath and the Au surface layer 15 is formed over the third Ni base layer 14 by electroplating to complete the outer lead.

Sample lots each of ten ceramic packages each provided with the outer lead of the present invention having 172 external leads 1 and sample lots each of ten ceramic packages each provided with a conventional outer lead having 172 external leads were subjected to corrosion resistance tests. Table 1 shows the results of the neutral salt spray test of the sample ceramic packages each provided with the conventional outer lead.

Nine kinds of conventional outer leads were fabricated by combining three thickness conditions of 2 μm, 3 μm and 4 μm for the plated Ni base layers and three thickness conditions of 2 μm, 3 μm and 4 μm for plated Au surface layers. Each external lead has a rectangular cross section of 0.18 mm in width and 0.13 mm in thickness. In the neutral salt spray test, the samples were exposed to the spray of a 3% NaCl solution at 35° C. for twenty-four hours.

As is evident from Table 1, the greater the thickness of the plated Ni base layer or the greater the thickness of the plated Au surface layer, the less is the number of defective external leads corroded due to pinholes, and 0.29% of the external leads were corroded due to pinholes reaching the base plate even if the thickness of the plated Ni base layer and that of the plated Au surface layer were a maximum of 4 μm. Thus, the conventional outer leads are not perfectly free of faulty external leads and hence are unsuitable for forming a ceramic package provided with very fine external leads.

Table 2 shows the results of the neutral salt spray test of the sample ceramic packages each provided with the outer lead of the present invention. Tested in this test were four kinds of outer leads of the present invention, i.e., ten outer leads having external leads each provided with a 2 μm thick Ni base layer formed by one cycle of plating and recrystallization annealing, ten outer leads having external leads each provided with two 1 μm thick Ni base layers formed by two cycles of plating and recrystallization annealing, ten outer leads having external leads each provided with three 0.7 μm thick Ni base layers formed by three cycles of plating and recrystallization annealing, and ten outer leads having external leads each provided with four 0.5 μm thick Ni base layers formed by four cycles of plating and recrystallization annealing. The thicknesses of the Au surface layers of those external leads are in the range of 2 to 4 μm.

From Table 2, the percentage of the defective external leads in the external leads each provided with two 1 μm thick Ni base layers formed by two cycles of plating and recrystallization annealing is 0.23%, which is smaller than the percentage of the defective external leads of the conventional outer leads each provided with a 4 μm thick Au surface layer of 0.29%. The percentage of the defective external leads in the external leads each provided with three 0.7 μm thick Ni base layers formed by three cycles of plating and recrystallization annealing and that of the defective external leads in the external leads each provided with four 0.5 μm thick Ni base layers formed by four cycles of plating and recrystallization annealing are only 0.06%.

It was found through the examination of the test results that it is more effective in preventing defective external leads being formed to form a plurality of comparatively thin Ni base layers by a plurality of cycles of plating and recrystallization annealing than to form a single comparatively thick Ni base layer by a single cycle of plating and recrystallization annealing.

Table 3 also shows the results of the neutral salt spray test of four kinds of ceramic packages provided respectively with kinds of outer leads in accordance with the present invention, i.e., outer leads having external leads each provided with on 3 μm thick Ni base layer formed by one cycle of plating and recrystallization annealing, outer leads having external leads each provided with two 1.5 μm thick Ni base layers formed by two cycles of plating and recrystallization annealing, outer leads having external leads each provided with three 1 μm thick Ni base layers formed by three cycles of plating and recrystallization annealing, and outer leads having external leads each provided with four 0.75 μm thick Ni base layers formed by four cycles of plating and recrystallization annealing. The thicknesses of the Au surface layers are in the range of 2 to 4 μm.

As is evident from Table 3, the percentage of the defective external leads each provided with two 1.5 μm thick Ni base layers is 0.12% which is smaller than that of the defective external leads of the conventional external lead structures, and the percentages of defective external leads each provided with three 1 μm thick Ni base layers and those each provided with four 0.75 μm thick Ni base layers are 0%. It is known from Table 3 that the formation of defective external leads having pinholes that will cause the corrosion of the base plate can be perfectly prevented by providing the external leads with a plated base structure of Ni consisting of three Ni base layers formed by three cycles of plating and recrystallization annealing, when the thickness of the plated base structure of Ni is 3 μm.

Table 4 also shows the results of the neutral salt spray test of four kinds of ceramic packages provided respectively with four kinds of outer leads in accordance with the present invention, i.e., outer leads having external leads each provided with a 4 μm thick Ni base layer formed by one cycle of plating and recrystallization annealing, external lead structures having external leads each provided with two 2 μm thick Ni base layers formed by two cycles of plating and recrystallization annealing, outer leads having external leads each provided with three 1.33 μm thick Ni base layers formed by three cycles of plating and recrystallization annealing, and outer leads having external leads each provided with four 1 μm thick Ni base layers formed by four cycles of plating and recrystallization annealing. The thicknesses of the plated Au surface layers are in the range of 2 to 4 μm.

As is evident from Table 4, the percentage of defective external leads each provided with two 2 μm thick Ni base layers is 0.06%, which is equal to the percentage of defective external leads each provided with three 0.7 μm thick Ni base layers and that of defective external leads each provided with four 0.5 μm thick Ni base layers shown in Table 2.

Accordingly, the outer leads having external leads each provided with two 2 μm thick Ni base layers is applicable to uses not requiring external leads having a very high corrosion resistance. The neutral salt spray tests proved that the corrosion preventing effect of the 4 μm thick plated base structure of Ni (Table 4) was not far higher than that of the 3 μm thick plated base structure of Ni (Table 3).

It was found through the neutral salt spray test of those sample ceramic packages that a plated base structure of Ni of 3 μm or above in thickness consisting of three or more base layers is perfectly free of pinholes penetrating the plated base structure of Ni and reaching the surface of the base plate, and outer lead having external leads provided with such a plated base structure of Ni is applicable to forming ceramic packages having very fine external leads.

Results of the comparative ferroxyl test of outer leads in accordance with the present invention and conventional outer leads will be described hereinafter. In the ferroxyl test, the number of through pinholes, i.e., pinholes penetrating the Ni base layer or layers and reaching the base plate of Kovar, per unit area of 50 cm2 on external leads for the different numbers of Ni base layers was measured.

Table 5 shows the numbers of through pinholes per 50 cm2 determined by the ferroxyl test in the external leads of conventional outer leads each provided with a 2 μm thick Ni base layer formed by one cycle of plating, the external leads of outer leads in accordance with the present invention each provided with two 1 μm thick Ni base layers formed by two cycles of plating and recrystallization annealing, the external leads of outer leads in accordance with the present invention each provided with three 0.7 μm thick Ni base layers formed by three cycles of plating and recrystallization annealing, and the external leads of outer leads in accordance with the present invention each provided with four 0.5 μm thick Ni base layers formed by four cycles of plating and recrystallization annealing.

As is evident from Table 5, whereas the external leads of the conventional outer leads, each provided with one 2 μm thick Ni base layer have forty-eight through pinholes per 50 cm2, the external leads of the outer leads of the present invention each provided with two 1 μm thick Ni base layers have only seven through pinholes per 50 cm2, the external leads of the outer leads of the present invention each provided with three 0.7 μm thick Ni base layers have only one through pinhole, and the external leads of the outer leads of the present invention each provided with four 0.5 μm thick Ni base layers do not have any pinhole. The results of the ferroxyl tests proved that the formation of through pinholes can be surely suppressed by forming a plated base structure of Ni by a plurality of cycles of plating and recrystallization annealing even if the plated base structure of Ni is not very thick.

Table 6 shows the numbers of through pinholes per 50 cm2 determined by the ferroxyl test in the external leads of conventional outer lead each provided with one 3 μm thick Ni base layer, the external leads of outer leads in accordance with the present invention each provided with two 1.5 μm thick Ni base layers formed by two cycles of plating and recrystallization annealing, the external leads of outer leads in accordance with the present invention each provided with three 1 μm thick Ni base layers formed by three cycles of plating and recrystallization annealing, and the external leads of outer leads in accordance with the present invention each provided with four 0.75 μm thick Ni base layers formed by four cycles of plating and recrystallization annealing.

As is evident from Table 6, whereas the leads of the conventional outer leads each provided with one 3 μm thick Ni base layer formed by one cycle of plating have thirty-six through pinholes per 50 cm2, the external leads of the outer leads each provided with two 1.5 μm thick Ni base layers have only four through pinholes per 50 cm2, and the external leads of the outer leads each provided with three 1 μm thick Ni base layers and those of the outer leads each provided with four 0.75 μm thick Ni base layers do not have any through pinhole. The ferroxyl test proved that the formation of through pinholes in a 3 μm thick plated base structure of Ni can be perfectly prevented by forming the 3 μm thick plated base structure of Ni by three or more cycles of plating and recrystallization annealing.

Table 7 shows the numbers of through pinholes per 50 cm2 determined by the ferroxyl test in the external leads of conventional outer lead each provided with one 4 μm thick Ni base layer, the external leads of outer leads in accordance with the present invention each provided with two 2 μm thick Ni base layers formed by two cycles of plating and recrystallization annealing, the external leads of outer leads in accordance with the present invention each provided with three 133 μm thick Ni base layers formed by three cycles of plating and recrystallization annealing, and the external leads of outer leads in accordance with the present invention each provided with four 1 μm thick Ni base layers formed by four cycles of plating and recrystallization.

As shown in Table 7, the external leads of the conventional outer leads each provided with one 4 μm thick Ni base layer have twenty through pinholes per 50 cm2, which is about half the numbers of through pinholes per 50 cm2 in the external leads of the conventional outer leads shown in Tables 5 and 6. This result justifies the common knowledge in the prior art that the thicker the Ni base layer, the less is the number of through pinholes.

On the other hand, the external leads each provided with the two 2 μm thick Ni base layers have only two through pinholes per 50 cm2, and the external leads each provided with three 1.33 μm thick Ni base layers and those each provided with four 1 μm thick Ni base layers do not have any through pinhole. Thus, the ferroxyl test proved that the formation of through pinholes in a 4 μm thick Ni base layer can be prevented in a very high probability by forming the Ni base layer by two cycles of plating and recrystallization annealing and that the formation of through pinholes in a 4 μm thick Ni base layer can be perfectly prevented by forming the Ni base layer by three or more cycles of plating and recrystallization annealing.

It was found through the examination of the foregoing test results that the thickness of the Ni base layer must be 3 μm and the Ni base layer must be formed by three or more cycles of plating and recrystallization annealing and that a method of forming the 3 μm thick Ni base layer by three cycles of plating and recrystallization annealing is most efficient in preventing the formation of through pinholes.

Since the plated base structure of Ni in accordance with the present invention consists of two or more plated Ni base layers and each of the plated Ni base layers is treated by recrystallization annealing, the plated Ni base layers have a dense texture capable of perfectly preventing the formation of pinholes penetrating the plated base structure and reaching the surface of the base plate.

Although the invention has been described specifically in its preferred embodiments, the present invention is not limited thereto in practical application and many changes and variations are possible therein without departing from the scope thereof. For example, the number of the Ni base layers and the thickness of the plated base structure may be selectively determined taking into consideration the size of the external leads. The base plate may be formed of a material, such as 42 alloy (42% Ni/Fe) or a Ni/Fe alloy of other composition having a thermal expansion coefficient approximately equal to that of ceramic (alumina or the like), other than Kovar having a thermal expansion coefficient approximately equal to that of the ceramic package.

Although the outer leads embodying the present invention have been described as combined with a flat package type ceramic package, the outer leads of the present invention may be used in combination with ceramic packages requiring the perfect elimination of through pinholes, such as pin grid array type ceramic packages, other than the flat package type ceramic package.

As is apparent from the foregoing description, the outer lead of the present invention for use in combination with a ceramic package for packaging a semiconductor IC is provided with the plated base structure formed over the surface of the base plate and consisting of a plurality of base layers formed by a plurality of cycles of plating and recrystallization annealing for promoting the growth of the grains of each base layer, and the Au surface layer formed over the plated base structure. Accordingly, the plated base structure has a dense structure and few pinholes, and hence the external leads of the outer lead are not subject to corrosion which may cause the disconnection and short circuit of the lines of the associated electric circuits even if the plated base structure is comparatively thin. Thus, the outer lead of the present invention is capable of being used in combination with a ceramic package packaging a multifunction IC having a high degree of integration, and the comparatively thin plated base structure is economically advantageous.

Although the invention has been described in its preferred form with a certain degree of particularity, obviously many changes and variations are possible therein. It is therefore to be understood that the present invention is not limited thereto in its practical application and may be practiced otherwise than as specifically described herein without departing from the scope and spirit thereof.

TABLE 1

| | | Thickness of the plated base structure of Ni | | |
|---|---|---|---|---|
| | | 2 μm | 3 μm | 4 μm |
| *1 | 2 μm | $\frac{56}{1720}$ (3.26%) | $\frac{23}{1720}$ (1.34%) | $\frac{17}{1720}$ (0.99%) |
| | 3 μm | $\frac{32}{1720}$ (1.86%) | $\frac{21}{1720}$ (1.22%) | $\frac{10}{1720}$ (0.58%) |
| | 4 μm | $\frac{18}{1720}$ (1.05%) | $\frac{11}{1720}$ (0.64%) | $\frac{5}{1720}$ (0.29%) |

(*1) Thickness of the Au surface layer

TABLE 2

| Thickness of the plated base structure of Ni (2 μm) | | | | |
|---|---|---|---|---|
| | One 2 μm thick plated base layer | Two 1 μm thick plated base layers | Three 0.7 μm thick plated base layers | Four 0.5 μm thick plated base layers |
| *2 | $\frac{32}{1720}$ (1.86%) | $\frac{4}{1720}$ (0.23%) | $\frac{1}{1720}$ (0.06%) | $\frac{1}{1720}$ (0.06%) |

(*2) Thickness of the Au surface layer (2–4 μm)

TABLE 3

| Thickness of the plated base structure of Ni (3 μm) | | | | |
|---|---|---|---|---|
| | One 3 μm thick plated base layer | Two 1.5 μm thick plated base layers | Three 1 μm thick plated base layers | Four 0.75 μm thick plated base layers |
| *3 | $\frac{21}{1720}$ (1.22%) | $\frac{2}{1720}$ (0.12%) | $\frac{0}{1720}$ (0%) | $\frac{0}{1720}$ (0%) |

(*3) Thickness of the Au surface layer (2–4 μm)

TABLE 4

| Thickness of the plated base structure of Ni (4 μm) | | | | |
|---|---|---|---|---|
| | One 4 μm thick plated base layer | Two 2 μm thick plated base layers | Three 1.33 μm thick plated base layers | Four 1 μm thick plated base layers |
| *4 | $\frac{10}{1720}$ (0.58%) | $\frac{1}{1720}$ (0.06%) | $\frac{0}{1720}$ (0%) | $\frac{0}{1720}$ (0%) |

(*4) Thickness of the Au surface layer (2–4 μm)

TABLE 5

/50 cm²
| Thickness of the plated base structure of Ni (2 μm) | | | | |
|---|---|---|---|---|
| | One 2 μm thick plated base layer | Two 1 μm thick plated base layers | Three 0.7 μm thick plated base layers | Four 0.5 μm thick plated base layers |
| *5 | 48 points | 7 points | 1 point | 0 point |

(*5) Through pinholes per 50 cm²

TABLE 6

/50 cm²
| Thickness of the plated base structure of Ni (3 μm) | | | | |
|---|---|---|---|---|
| | One 3 μm thick plated base layer | Two 1.5 μm thick plated base layers | Three 1 μm thick plated base layers | Four 0.75 μm thick plated base layers |
| *6 | 36 points | 4 points | 0 point | 0 point |

(*6) Through pinholes per 50 cm²

TABLE 7

/50 cm²
| Thickness of the plated base structure of Ni (4 μm) | | | | |
|---|---|---|---|---|
| | One 4 μm thick plated base layer | Two 2 μm thick plated base layers | Three 1.33 μm thick plated base layers | Four 1 μm thick plated base layers |
| *7 | 20 points | 2 points | 0 point | 0 point |

(*7) Through pinholes per 50 cm²

What is claimed is:

1. An external terminal for an IC package, comprising:
   a base plate;
   a plated base structure formed over the surface of said base plate and comprising at least three plated and annealed base layers, the total thickness of said plated base layers being at least 3 μm, each of said plated base layers having a dense recrystallized grain structure produced by an annealing process that promotes the growth of grains of the plated base layers, said annealing process being conducted individually on each of said at least three plated base layers after its formation; and a surface layer formed over an uppermost one of said plated base layers.

2. The outer lead according to claim 1, wherein said plated base layers are formed of nickel (Ni) or a nickel alloy.

3. The outer lead according to claim 1, wherein said surface layer is formed of gold (Au) or a gold alloy.

4. The outer lead according to claim 1, wherein said base plate is formed of a material having a thermal expansion coefficient substantially equal to that of said package of said semiconductor IC package.

5. The outer lead according to claim 4, wherein said package is formed of alumina and said base plate is formed of a Fe/Ni alloy.

6. The outer lead according to claim 1, wherein a package type of said semiconductor IC package is one of a flat package type and a pin grid array type.

7. An external terminal for an IC package, comprising:

a base plate;

a plated base structure formed over the surface of said base plate and comprising at least three plated and annealed base layers of nickel (Ni) or a nickel alloy, the total thickness of said plated base layers being at least 3 µm, each of said plated base layers having a dense recrystallized grain structure produced by an annealing process that promotes growth of grains of the plated base layers, said annealing process being conducted individually on each of said at least three plated base layers after its formation; and a surface layer of gold (Au) or a gold alloy, formed over an uppermost one of said plated base layers.

8. The outer lead according to claim 7, wherein said base plate is formed of a material having a thermal expansion coefficient substantially equal to that of said package of said semiconductor IC package.

9. The outer lead according to claim 7, wherein said package is formed of alumina, and said base plate is formed of a Fe/Ni alloy.

10. The outer lead according to claim 7, wherein a package type of said semiconductor IC package is one of a flat package type and a pin grid array type.

* * * * *